(12) United States Patent
Jezewski et al.

(10) Patent No.: US 11,652,067 B2
(45) Date of Patent: May 16, 2023

(54) METHODS OF FORMING SUBSTRATE INTERCONNECT STRUCTURES FOR ENHANCED THIN SEED CONDUCTION

(71) Applicant: Intel Corporation, Santa Clara, CA (US)

(72) Inventors: Christopher J. Jezewski, Portland, OR (US); Radek P. Chalupa, Portland, OR (US); Flavio Griggio, Portland, OR (US); Inane Meric, Hillsboro, OR (US); Jiun-Chan Yang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 16/465,126

(22) PCT Filed: Dec. 28, 2016

(86) PCT No.: PCT/US2016/068798
§ 371 (c)(1),
(2) Date: May 29, 2019

(87) PCT Pub. No.: WO2018/125069
PCT Pub. Date: Jul. 5, 2018

(65) Prior Publication Data
US 2020/0402921 A1 Dec. 24, 2020

(51) Int. Cl.
*H01L 23/00* (2006.01)
*H01L 21/768* (2006.01)
*H01L 23/522* (2006.01)

(52) U.S. Cl.
CPC ........ *H01L 23/562* (2013.01); *H01L 21/7684* (2013.01); *H01L 23/5226* (2013.01)

(58) Field of Classification Search
CPC ............... H01L 23/562; H01L 21/7684; H01L 23/5226; H01L 21/76873; H01L 23/522; H01L 23/485; H01L 23/585; C23C 18/1653; C23C 18/38; C25D 7/123
See application file for complete search history.

(56) References Cited

U.S. PATENT DOCUMENTS 7,442,267 B1 10/2008 Webb et al.
8,513,124 B1 8/2013 Ponnuswamy et al.
(Continued)

FOREIGN PATENT DOCUMENTS

KR 10-2014-0040936 4/2014

OTHER PUBLICATIONS

International Search Report and Written Opinion for International Patent Application No. PCT/US16/68798, dated Sep. 18, 2017.

*Primary Examiner* — Wasiul Haider
(74) *Attorney, Agent, or Firm* — Essential Patents Group, LLP

(57) ABSTRACT

Methods/structures of forming substrate tap structures are described. Those methods/structures may include forming a plurality of conductive interconnect structures on an epitaxial layer disposed on a substrate, wherein individual ones of the plurality of conductive interconnect structures are adjacent each other, forming a portion of a seed layer on at least one of the plurality of conductive interconnect structures, and forming a conductive trace on the seed layer.

14 Claims, 12 Drawing Sheets

(56) References Cited

U.S. PATENT DOCUMENTS

| | | | |
|---|---|---|---|
| 2005/0051801 A1* | 3/2005 | Shaw | H01L 27/11807 |
| | | | 257/202 |
| 2006/0164881 A1* | 7/2006 | Oki | H01L 27/1104 |
| | | | 257/E27.098 |
| 2011/0259750 A1 | 10/2011 | Hafezi et al. | |
| 2012/0241917 A1* | 9/2012 | Ide | H01L 23/585 |
| | | | 257/622 |
| 2013/0026580 A1* | 1/2013 | Morimoto | G11C 11/412 |
| | | | 257/E27.099 |
| 2013/0119469 A1* | 5/2013 | Iwamatsu | H01L 27/1104 |
| | | | 257/347 |
| 2016/0365335 A1 | 12/2016 | Black et al. | |
| 2017/0346485 A1* | 11/2017 | Chen | H03K 17/6874 |

* cited by examiner

METHODS OF FORMING SUBSTRATE INTERCONNECT STRUCTURES FOR ENHANCED THIN SEED CONDUCTION

CLAIM OF PRIORITY

This Application is a National Stage Entry of, and claims priority to, PCT Application No. PCT/US2016/068798, filed on Dec. 28, 2016 and titled "METHODS OF FORMING SUBSTRATE INTERCONNECT STRUCTURES FOR ENHANCED THIN SEED CONDUCTION", which is incorporated by reference in its entirety for all purposes.

BACKGROUND OF THE INVENTION

Electroplating is a physical deposition technique that may be utilized in the fabrication of microelectronic devices, such as in the fabrication of conductive interconnect structures commonly used for routing electrical signals in integrated chips/die, for example. In some cases, a seed layer may be formed prior to forming a bulk portion of the conductive material of the interconnect structure. The seed layer may provide an electrical path for the electroplating process.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
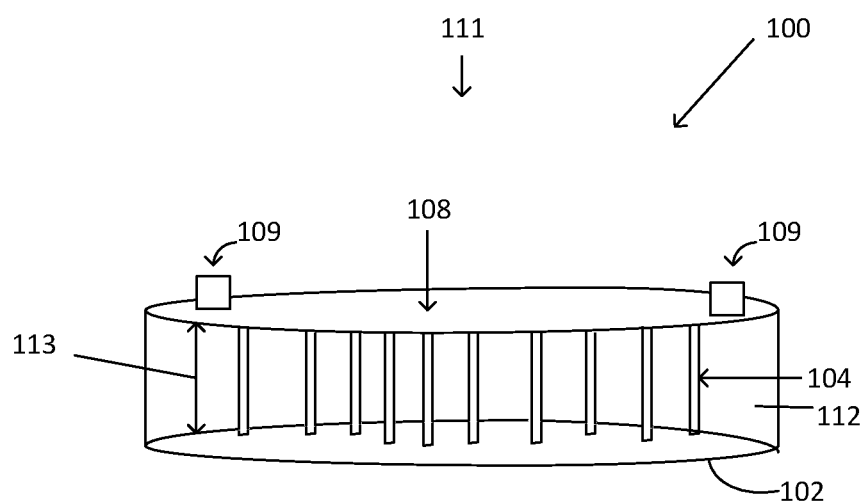
FIG. 1a is a side perspective view of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them. Embodiments of methods of forming device structures, such as methods of forming substrate tap structures for improving interconnect layer uniformity during an electroplating process, are disclosed. Those methods/structures may include forming a plurality of conductive interconnect structures on an epitaxial layer disposed on a substrate, wherein individual ones of the plurality of conductive interconnect structures are adjacent each other, forming a portion of a seed layer on at least one of the plurality of conductive interconnect structures, and forming a conductive trace on the seed layer. The embodiments herein enable the formation of substrate tap structures comprising a density and resistance sufficient to effect a combined substrate and seed conduction that may be utilized to produce increased uniformity in electroplated thin films. The embodiments further enable the utilization of uniform interconnect layer electroplating processes that may be utilized with devices comprising geometries/critical dimensions of below about 20 nm.

The various Figures herein illustrate embodiments of fabricating substrate taps for improving thin film electroplating conduction in wafer fabrication, such as during microelectronic device fabrication, for example. In FIG. 1a (side perspective view), a wafer, such as a silicon wafer 100, may comprise a plurality of die (not shown). The wafer 100 may comprise various conductive and dielectric materials with which to fabricate device structures, such as transistor structures, for example, that may be electrically and physically coupled by interconnect structures/traces, in embodiments. In an embodiment, the wafer 100 may comprise a 300 mm wafer, but may comprise any suitable size according to embodiments. The wafer 100 may comprise a seed layer 108, such as a seed layer upon which metallization traces may be formed, wherein the metallization traces may route electrical signals within individual die of the wafer 100.

The seed layer 108 may be used to plate/form interconnect structures which may comprise conductive traces, that may be used to couple with device structures/circuit elements (such as transistors and passive devices) within each die, in an embodiment. The seed layer 108 may be physically and electrically coupled with a plurality of conductive interconnect structures 104, which may comprise a plurality of substrate tap structures 104, which electrically and physically couple the seed layer 108 to a substrate 102. The conductive interconnect structures 104 may be disposed within/adjacent to a dielectric material 112, in an embodiment. In an embodiment, the conductive interconnect structures 104 may comprise a height 113, which may comprise between about 500 nm to about 1000 nm, in an embodiment, and may comprise any suitable height in another embodiment, according to the particular design requirements.

In an embodiment, individual ones of the conductive interconnect structures 104, which may comprise an array or a plurality of conductive interconnect structures 104, may be substantially parallel with each other. The conductive interconnect structures 104 may extend upwards through different levels of metallization, wherein the levels of metallization may comprise up about ten levels, but may comprise more or less levels of metallization, depending upon the particular application. The conductive interconnect structures 104 may be electrically and physically coupled with each metallization layer of within each die of the wafer 100, in an embodiment.

In an embodiment, the conductive interconnect structures 104 may be substantially orthogonal/perpendicular to the seed layer 108. In other embodiments, the seed layer 108 and conductive interconnect structures 104 may comprise within about 80 to about 110 degree angles with respect to each other, depending upon the particular application.

The seed layer 108 may be formed on a surface of the wafer 100 by employing a any suitable formation process, such as physical deposition process including physical vapor deposition (PVD), atomoc layer depostion (ALD), or an electroless plating process, or any other suitable formation process, such as formation process 111, for example. In an embodiment, the seed layer 108, which may comprise a conductive/metallic material, such as copper, may be formed prior to the formation of a bulk conductive material which may be subsequently formed on the seed layer 108. The seed layer 108 may provide an electrical path during an interconnect formation process, that may apply a current (for example, between electrodes 109) across the wafer 100. The formation process 111 may comprise placing/submersing the wafer 100 into a plating bath, which in turn may comprise chemical constituents such as copper, chlorine ions, sulfuric acid, copper sulfate, accelerators, suppressants and solvents, for example. Other chemical constituents may be used according to the particular design requirements.

In an embodiment, the seed layer 108 may comprise a thickness of between about 1 nm to about 10 nm, in an embodiment wherein critical dimensions of device features within a die are less than about 20 nm, but may comprise other thicknesses according to the particular design. In an embodiment, the seed layer 108 may be subsumed into the bulk conductive layer during an interconnect formation process, such as an electroplating process. In an embodiment, the bulk conductive layer may comprise copper, and may comprise portions of conductive traces that may route signals to various circuit elements within individual die of the wafer 100.

An effective electrical resistance of an electrode material, such as the seed layer 108, is referred to as a terminal effect. In electroplating processes, the terminal effect can lead to a thickness variation from an edge of a wafer (such as wafer 100), to its center.

The embodiments herein provide solutions for a high resisitivity that may be associated with decreased thickness of the seed layer, which may I turn potentially result in poor interconnect layer thickness uniformity across a wafer after an electroplating process. Thin seed layer conduction may by assisted by using the low resistance of a doped silicon substrate, such as in the substrate 102 of FIG. 1*a*, for example.

In an embodiment, the doped silicon substrate may comprise an epitaxial doped region of the substrate 102, wherein substrate taps 104 enable the seed 108 and substrate 102 to conduct in parallel with each other. The improved total conduction of seed 108 and substrate 102 components result in a more uniform equipotential at the seed layer 108 across the wafer 100, and reduce terminal effects. As critical dimensions within the die become lower than about 20 nm, gapfill of such ever decreasing device features may become increasingly challenging.

However, by assisting the seed 108 conduction by designing substrate taps 104 with sufficient density and resistance, the combined substrate 102 and seed 108 conduction becomes sufficient to enable uniform electroplating. In an embodiment, the substrate taps/interconnects 104 may be formed such that equipotentialization (and thus interconnect structure thickness uniformity) of the surface of the wafer 100 may be achieved by the use of the substrate taps 104. The embodiments herein alleviate the requirement of utilizing a low resistance seed layer 108, and allow for further thinning of the seed layer thickness, by at least partially relying on the underlying conductive substrate 102 and an array of interconnects/taps that provide seed to substrate contacts, as will be further described herein.

Figure 1B:
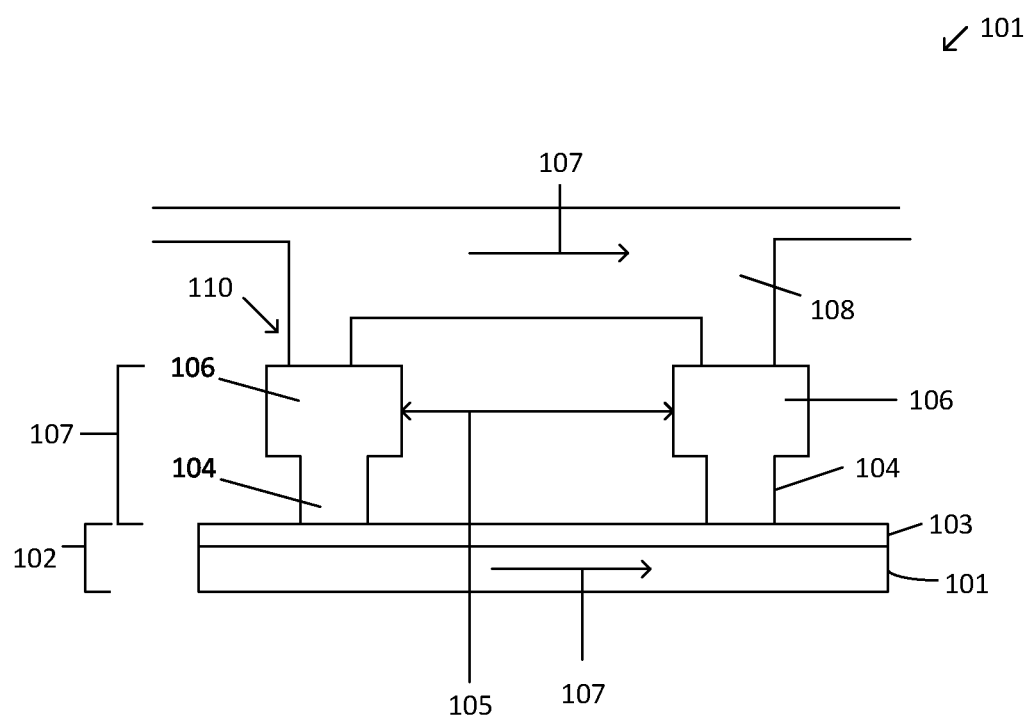
FIG. 1b is a side cross-sectional view of structures according to embodiments.

Referring to FIG. 1*b*, a portion of a wafer 101 is shown, which may comprise a portion of a die/device, in an embodiment. A substrate 102 may comprise a second portion 103, disposed on a first portion 101. The substrate 100 may comprise semiconducting and/or insulating materials, in an embodiment. The substrate 102 may comprise materials such as, but not limited to, silicon, silicon-on-insulator, germanium, indium antimonide, lead telluride, indium arsenide, indium phosphate, gallium arsenide, gallium antimonide, or combinations thereof. In an embodiment the second portion 103 of the substrate 102 may comprise an epitaxial layer 103. The epitaxial layer 103 may comprise a lower doping level than a doping level of the first portion 101 of the substrate 102, in an embodiment. For example, a doping level of the first portion 101 may comprise between about $1 \times 10^{15}$ atoms/cm$^3$ to about $1 \times 10^{18}$ atoms per cm$^3$, wherein the second portion 103 may comprise a lower doping level, in an embodiment, and may comprise an order of magnitude lower, in an embodiment.

At least one conductive interconnect structure 104 may be physically and electrically coupled with the second portion 103 of the substrate 102 and to the seed layer 108. In an embodiment, the conductive interconnect structures 104 may comprise materials such as copper, cobalt, gold, silver, copper, nickel, platinum and their alloys, for example. The at least one conductive interconnect structure 104 may comprise at least one substrate tap 104, which may be physically and electrically coupled with the substrate 102. In an embodiment, the at least one substrate tap 104 may comprise a portion of a damascene structure 107, wherein the at least one substrate tap comprises a via portion 104, and a trench portion 106 that may be coupled to the via 104.

In an embodiment, a portion 110 of a seed layer 108 may be landed onto the trench 106 portion of the at least one substrate tap 104. In an embodiment, the substrate tap(s) 104 assist the seed layer 108 conduction during subsequent electroplating by using the low resistance of the epitaxial region 103 of the substrate 102, wherein the seed layer 108 and the substrate 102 conduct in parallel 107 with respect to each other. The improved total conduction of the seed layer 108 and the substrate 102 components result in a more uniform equipotential at the seed layer 108 surface across the wafer 100, and reduces terminal effects (and thus reduces electroplated thickness non-uniformity) during subsequent electroplating processes. In cases where the seed layer 108 may be un-landed (not in physical contact) with the substrate taps 104, the seed layer 108 alone conducts current during electroplating, and may result in a less uniform electroplated metal line layer thickness as critical dimensions of device features decrease below about 20 nm.

In an embodiment, adjacent substrate taps 104 may comprise a spacing 105 between them. The spacing 105 may vary according to a desired sheet resistance of the seed layer 108, for particular design requirements. In an embodiment, the number and density of substrate tap structures 104 sufficient to produce a sheet resistance of the seed layer 108 of at least 100 ohms per square, and up to about 2,000 ohms per square, as measured at the seed layer 108, will depend upon the particular design requirements, but may be optimized for particular applications. The substrate tap 104 density may comprise an optimized number of substrate taps 104 comprising ohmic contact with the substrate 102 and physically and electrically coupled with the seed layer 108, and may comprise an optimized spacing 105 to achieve a seed layer 108 sheet resistance of between about 50 Ohms/square to about 100 Ohms per square, in an embodiment.

Figure 5:
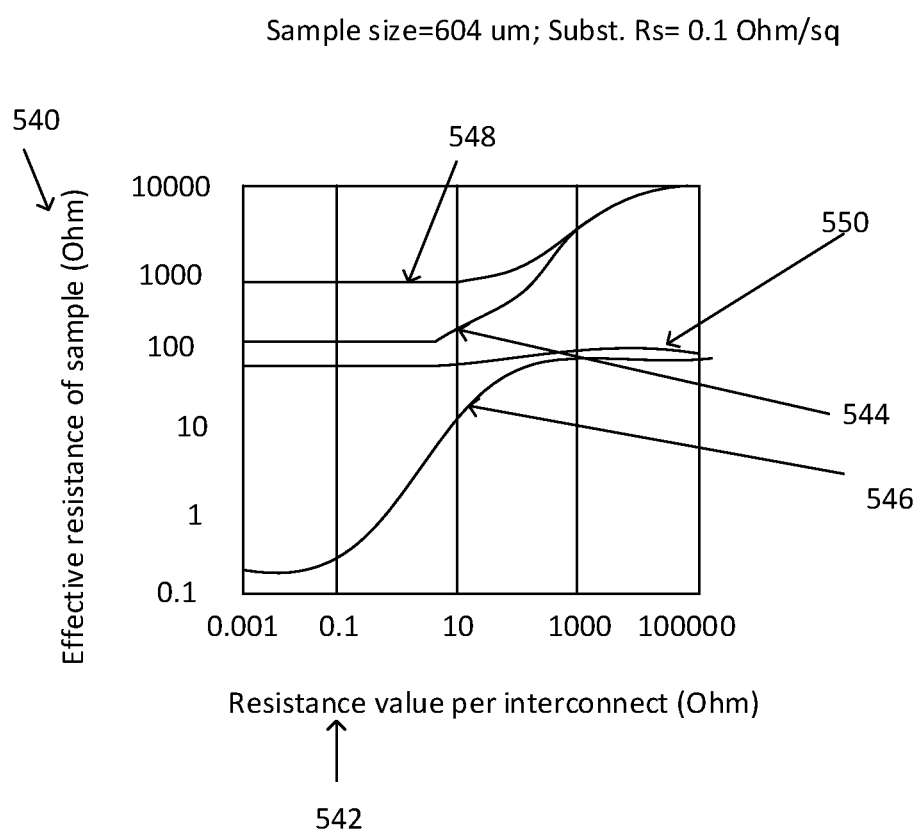
FIG. 5 depicts a graph of sample resistance vs. resistance value per interconnect according to embodiments.

The substrate tap 104 spacing 105 may be dependent on substrate tap 104 resistance and substrate tap 104 density across a particular wafer. FIG. 5 depicts examples of ranges of values which enhance seed layer conduction by optimizing substrate resistance, substrate tap resistance, and tap density, in an embodiment. Effective resistance of a sample 540 is plotted versus resistance value per interconnect 542 for a substrate comprising a sheet resistance of about 0.1 Ohm/square. For a square sample of about 600 microns on its side, two seed sheet resistance values (100 Ohms/square (at 1 micron 546) and 10,000 Ohms/sq (at 1 micron) 544) and two densities (spacing) of interconnects (1 micron and 32 microns (at 100 Ohms/sq 550, and 10,000 Ohms/sq) 548) are depicted. Effective resistance of the stack 640 (seed-interconnect tap-substrate) is reported for a wide range of interconnect resistance values. In an embodiment, a density of the substrate taps for a given area may comprise a spacing of between about 1 micron and about 32 microns, and a sheet resistance of the stack may comprise about 100 Ohms per square to about 10,000 Ohms per square.

Figure 6:
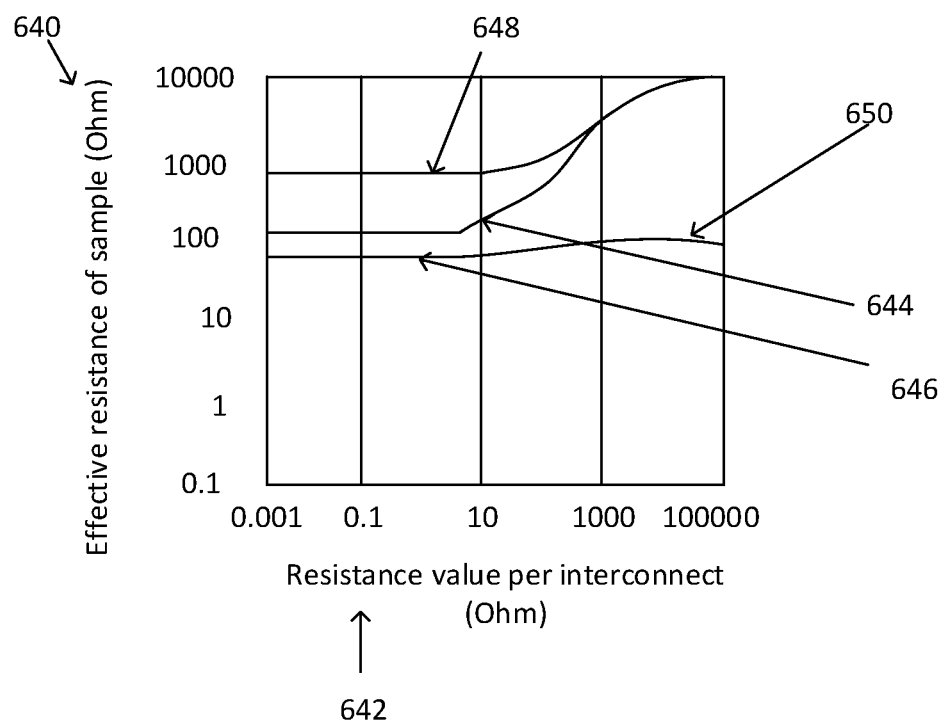
FIG. 6 depicts a graph of sample resistance vs. resistance value per interconnect according to embodiments.

FIG. 6 depicts effective resistance of a sample 640 versus resistance value per interconnect 642 for a substrate comprising a sheet resistance of about 100 Ohm/square, which may be as large as a seed layer resitance in some cases. Two seed sheet resistance values (100 Ohms/square (at 1 micron 646) and 10,000 Ohms/sq (at 1 micron) 644) and two densities (spacing) of interconnects (1 micron and 32 microns (at 100 Ohms/sq 650, and 10,000 Ohms/sq) 648) are depicted. The presence of a higher resistance substrate may still enhance the seed layer conduction, since the seed layer and the substrate can be made to act as parallel resistors by designing sufficiently low resitance interconnect tap structures.

Figure 2A:
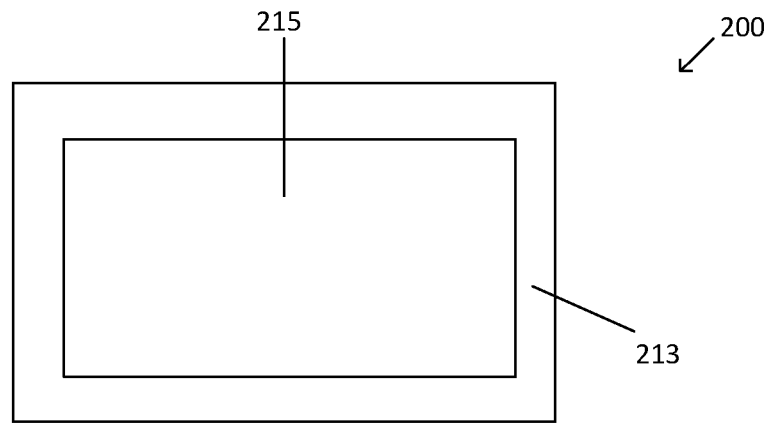
FIG. 2a represents a top view of structures according to embodiments.
Figure 2B:
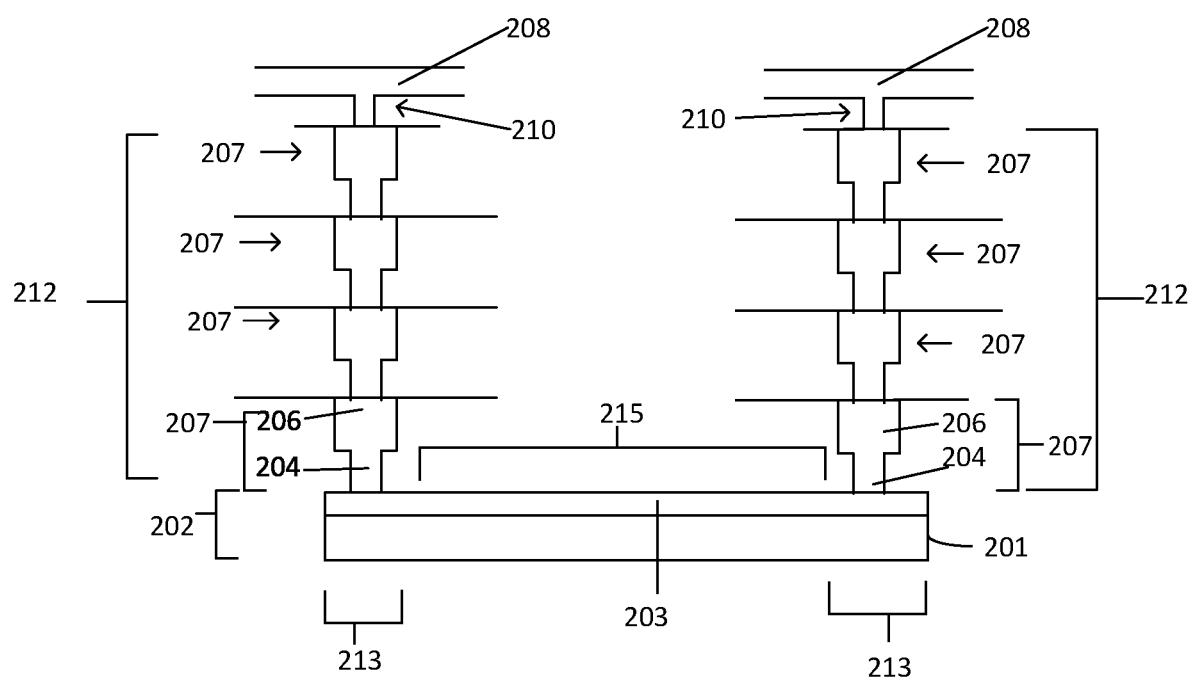
FIG. 2b represents a cross-sectional view of structures according to embodiments.

Referring back to FIG. 2a (top view), a wafer 200 is depicted, similar to the microelectronic wafer 100 of FIG. 1a, for example, wherein a first portion 215 comprises various integrated circuit components, such as transistors, resistors, capacitors, and the like, and a second portion 213 comprises a guard ring portion, wherein there are little to no integrated circuit components disposed thereon. The guard ring portion 213 may comprise a plurality of guard rings 212 disposed within the guard ring portion, each of which may comprise via 204 portions and a trench portions 206 stacked upon each other, in an embodiment, and may surround the first portion 215, and may optionally provide hermetic encapsulation for the first portion 215 (FIG. 2b, cross sectional view, not to scale). In an embodiment, the trench portion 206 disposed on the via portion 204 may comprise a damascene structure 207, but in other embodiments, the guard rings 212 may comprise any other suitable structures, depending upon the particular design requirements.

In an embodiment, the guard rings 212 may be disposed directly on the substrate 202, and may be in direct ohmic contact with the substrate 202, and may be in direct ohmic contact with an epitaxial region 203 of the substrate 202. The epitaxial region 203 may comprise a lightly doped region of silicon, in an embodiment, and may comprise a doping level that is an order of magnitude less than a doping level of the first portion 201 of the substrate 202. The guard ring structures 212 may be landed in/on the substrate 202, and may provide substrate taps/conductive interconnects for each subsequently plated interconnect layer, such as conductive layer 208, shown landed to a top portion 210 of the stacked guard ring 212. In other embodiments, the conductive layer 208 may comprise seed/interconnect plated layers which may be physically and electrically coupled with the guard structure at any point along the vertical structure of the guard rings 212.

In an embodiment, the conductive layers 208 may comprise metal layers within a device, such as a first metal layer, a second metal layer disposed on/over the first metal layer, and so on. In an embodiment, a density of the guard rings 212, as reflected in a spacing between adjacent guard ring structures within the guard ring area 213, and/or a width and an area of the guard ring structures, may be designed/optimized sufficiently to enable a sheet resistance of at least 100 Ohms/sq as measured at the conductive/seed layer 208. A density/spacing of the guard rings may comprise about 1 micron to about 32 microns in an embodiment, but may vary according to the application, and a sheet resistance of the tap stack including the seed layer may comprise about 50 Ohms per square to about 2,000 Ohms per square in an embodiment. The guard rings 212 may additionally provide another source for grounding to the substrate 202.

Figure 3A:
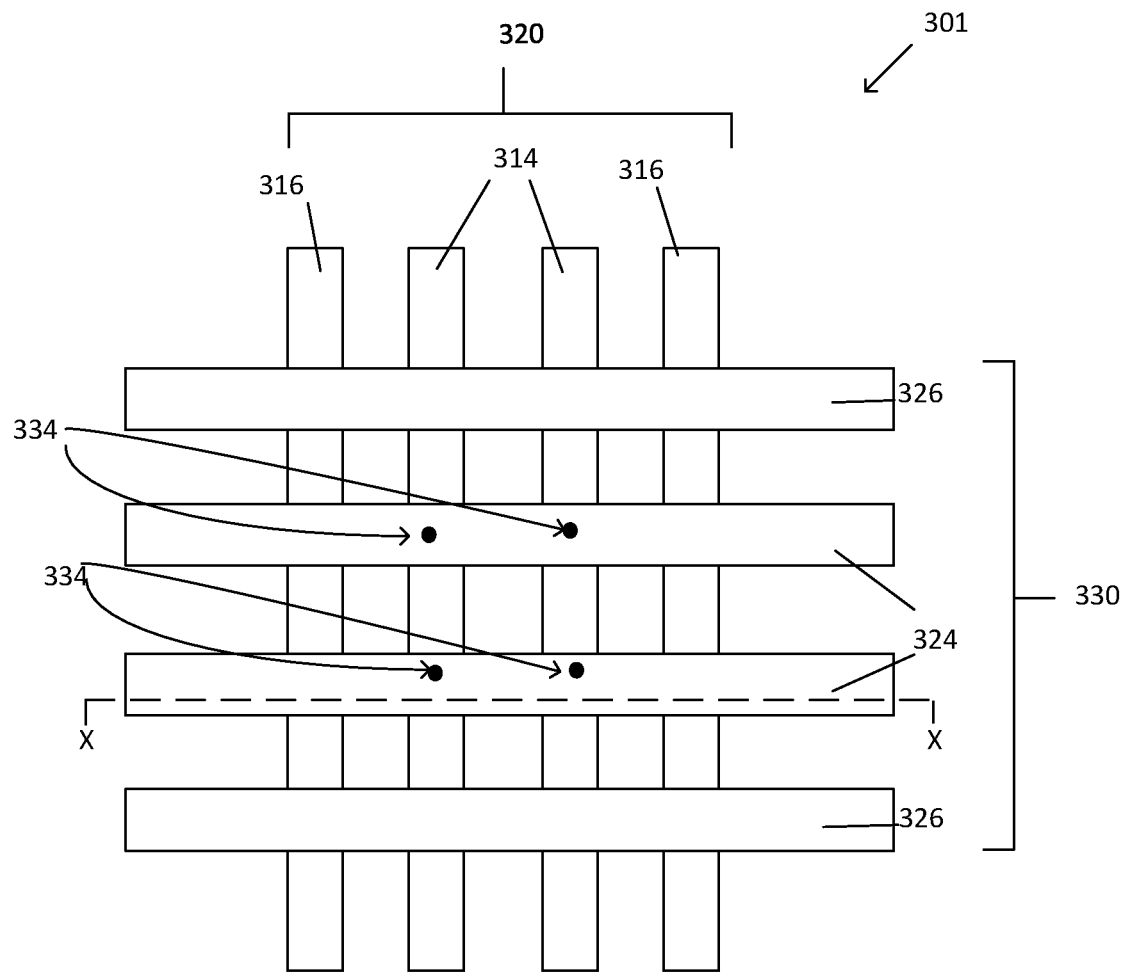
FIG. 3a represents a top view of structures according to embodiments.

FIG. 3a (top view), depicts a portion of a device/die 301 that may in turn comprise a portion of a wafer (such as wafer 100 of FIG. 1a, for example). The portion of the die 301 may comprise circuit layers 320, 330, that may be formed/disposed in a surrounding insulator material (such as an inter-layer dielectric material, or any other suitable dielectric material). The circuit layers 320, 330 may comprise interconnect traces with which to route electrical signals to/between circuit elements, such as to/within transistors and/or passive devices, for example. The circuit layers 320, 330 may additionally comprise any number of passive and active circuit components, according to the particular application.

In an embodiment, each of a first and a second circuit layer 320, 330 may comprise at least one interconnect structures/trace line 316, 326 and may further comprise at least one filler line/dummy structure 314, 324 respectively. In an embodiment, a plurality of filler lines 314, 324 may be disposed between an adjacent pair of interconnect lines 316, 326 respectively. In an embodiment, the at least one interconnect structure 316, 326 and/or the at least one filler line 314, 324 may comprise any of a wide range of electrically conductive metals/materials. Some example materials suitable for interconnect/filler lines may include, but are not necessarily limited to: copper (Cu); aluminum (Al); silver (Ag); nickel (Ni); gold (Au); titanium (Ti); indium (In); tungsten (W); ruthenium (Ru); cobalt (Co); chromium (Cr); iron (Fe); manganese (Mn); hafnium (Hf); tantalum (Ta); vanadium (V); molybdenum (Mo); palladium (Pd); platinum (Pt); Iridium (Ir), Rhenium (Re), and Rhodium (Rh), Osmium (Os) and/or an alloy or combinations thereof.

In an embodiment, the first circuit layer 320 may be above (or below) the second circuit layer 330, such that the first and second circuit layers 320, 330 may exist/be disposed in separate planes/levels from each other, in some cases. In an embodiment, conductive interconnect traces 316 may be adjacent the filler/dummy structures 314 within the first circuit layer 320, and the interconnect traces 326 may be adjacent the fillers/dummy structures 324 in the second circuit layer 320. In an embodiment, a filler line 324 from the second circuit 330 may be intersected (e.g., crossed over or otherwise overlapped) with a filler line 314 from the first circuit 320, for example, at locations/regions 134. In FIG. 3a, four intersection locations 334 are shown.

Figure 3B:
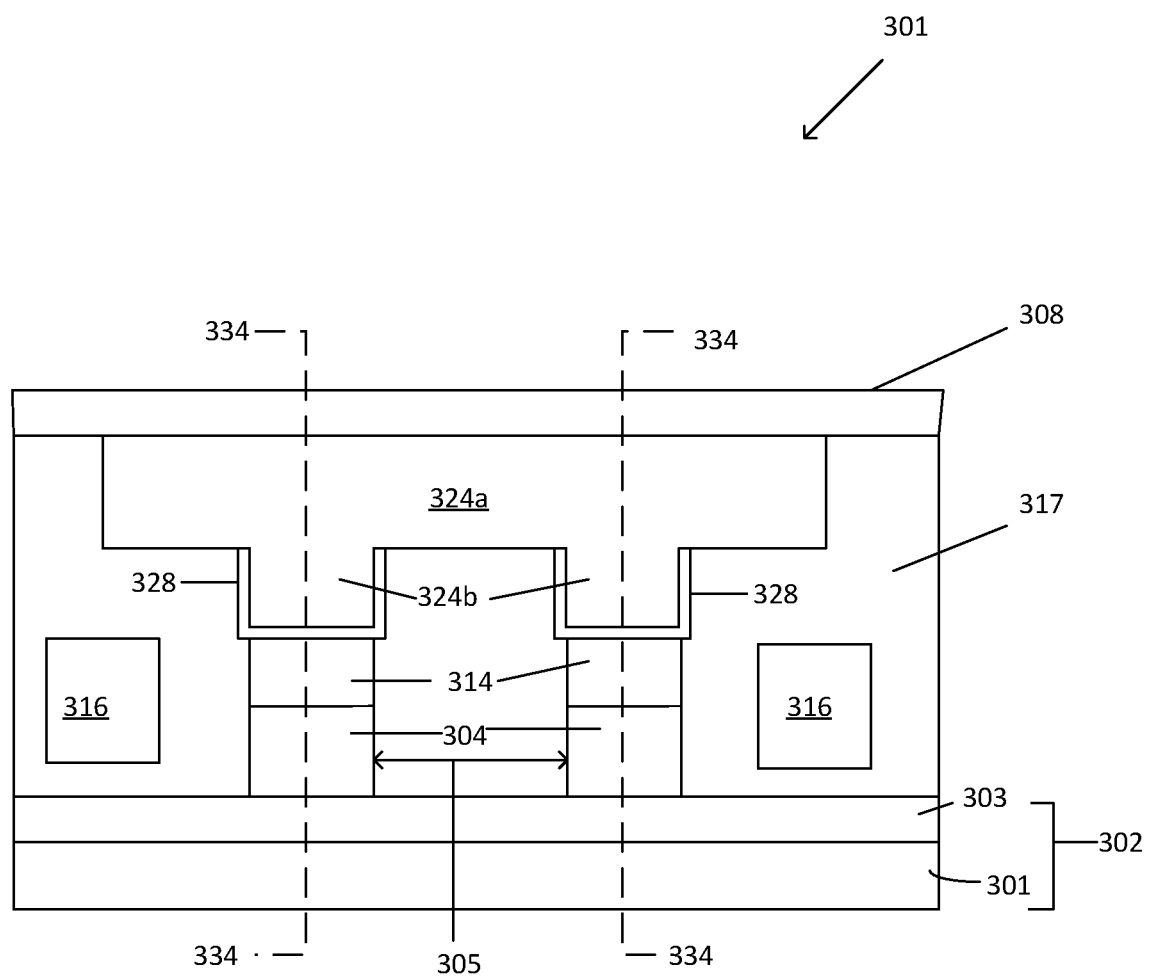
FIGS. 3b-3c represent cross-sectional views of structures according to embodiments.

In an embodiment, the intersection regions 334 provide an opportunity to couple a substrate tap structure to a filler/dummy structure, which aids in improving a seed layer conduction during an electroplating process, as discussed previously herein. In an embodiment, a filler line 324 of the second circuit 330 may be configured, for example, as a dual-damascene structure having one or more vias 324b extending from a trench 324a and may be landed at a given filler/dummy structure line 314, as shown in the FIG. 3b (cross-sectional view). Such a via 324b may serve, in accordance with an embodiment, to physically couple a given filler line 324 to a given filler line 314, thus serving to physically and electrically couple together circuit layers 320, 330.

In an embodiment, the via 324b may have a substantially box-like geometry. However, other geometries may be provided, in accordance with an embodiment, and may depend, at least in part, on: (1) the profile/geometry of a given filler line 324 and/or a given filler line 314; and/or (2) the orientation of second circuit layer 330 relative to first circuit layer 320. Furthermore, the dimensions of a given via 324b, trench 324a may comprise any of a wide variety of configurations.

In an embodiment, a barrier layer/adhesion layer 328 may be provided, for example, during the formation of die portion 300 using any of a wide range of deposition techniques/processes, such as, but not necessarily limited to: (1) chemical vapor deposition (CVD); (2) physical vapor deposition (PVD) (e.g., sputtering); (3) spin coating/spin-on deposition (SOD); (4) electron beam evaporation; and/or (5) a combination of any of the aforementioned. In an embodiment, barrier and/or adhesion layer 328 may be provided with any given thickness, as desired for a given target application or end-use. However, as previously noted, layer 328 may be optional in some cases and thus may be omitted.

In some embodiments, layer 328 may be at least partially conductive and is disposed between a dielectric material 317 and a via 324b interface. The barrier/adhesive layer 328 may comprise conductive materials such as, but not limited to, titanium (Ti), titanium nitride (TiN), tantalum (Ta), tantalum nitride (TaN), and ruthenium (Ru), to name a few. In an embodiment, the barrier/adhesion layer 328 may be selected so as to provide an electrical and/or thermal insulation layer between the lines being coupled together. In another embodiment, the adhesion/barrier layer 328 may comprise such non-conductive materials as silicon nitride (Si3N4), silicon dioxide (SiO2), silicon oxynitride (SiOxNy), titanium nitride (TiN), and silicon carbon nitride (SiCN).

In some embodiments, dielectric material 317 may comprise a material having a dielectric constant, for example, that is less than the dielectric constant of silicon dioxide (SiO2). In some embodiments, the dielectric material 317 may comprise a substantially non-porous material, whereas in some other embodiments, the dielectric material 317 may be provided with any degree of porosity, as desired for a given target application or end-use.

By coupling the via filler/dummy structures 314 to the substrate taps 304 that are ohmically contacted to the substrate 302, in sufficient density to enable sheet resistance of at least 100 Ohms/sq at the seed layer 308, conduction of the seed layer 308 is enhanced and the terminal effect is reduced. Uniformity of subsequently plated interconnect structures is improved. In an embodiment, at substantially every point that the filler/dummy structures 324, 314 cross circuit layer to circuit layer (for example circuit layer 330 crossing over circuit layer 320), there is a possible location to make electrical and physical connection from the substrate 302 throughout the stack (substrate 302 to substrate tap 304 to filler/dummy 324, 314 to seed layer 308).

In an embodiment, a density of the substrate taps 304, as reflected in a spacing 305 between adjacent substrate taps 304 may be designed/optimized to enable a sheet resistance of at least about 100 Ohms/sq as measured at the conductive/seed layer 308, in an embodiment. A density/spacing 305 of the substrate taps 304 may comprise about 1 micron to about 32 microns in an embodiment, but may vary according to the application, and a sheet resistance of the stack including the seed layer may comprise about 50 to about 2,000 Ohms per square in an embodiment.

Figure 3C:
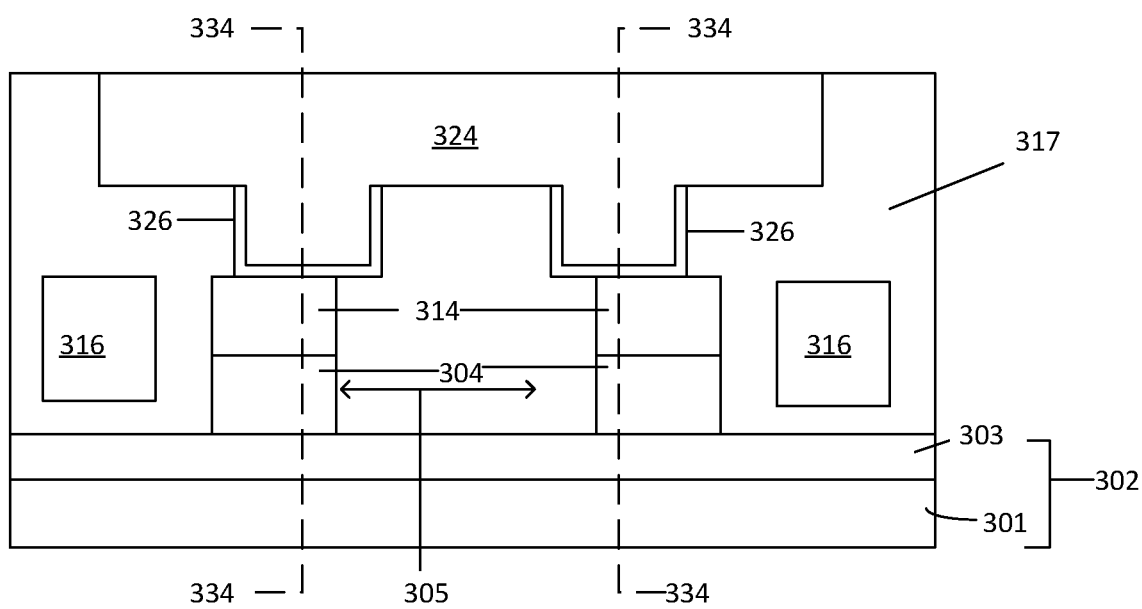

In FIG. 3c (cross-sectional view) the filler/dummy structures 324 of the second circuit layer 330 may be partially landed onto the filler/dummy structures 314 of the first circuit layer 320. The substrate tap structures 304 may be physically and electrically coupled with the substrate 302 and the filler dummy structures 314. The density of the substrate taps 304 may be optimized to enable the sheet resistance of at least 100 Ohms/sq as measured at the seed layer 308. In another embodiment, substrate tap structures 304 may be added to filler structures, such as filler structures 314, that may be present within the die/wafer from previous processing steps, according to the particular application.

In some embodiments, the disclosed substrate taps may be compatible with any of a wide variety of interconnect and/or filler line contexts and structures. Some example such structures of substrate taps may include, but are not necessarily limited to: single-damascene structures; dual-damascene structures (e.g., a line with an underlying via); anisotropic structures; isotropic structures; and/or any other desired IC structures, interconnects, or other conductive structures.

Figure 4:
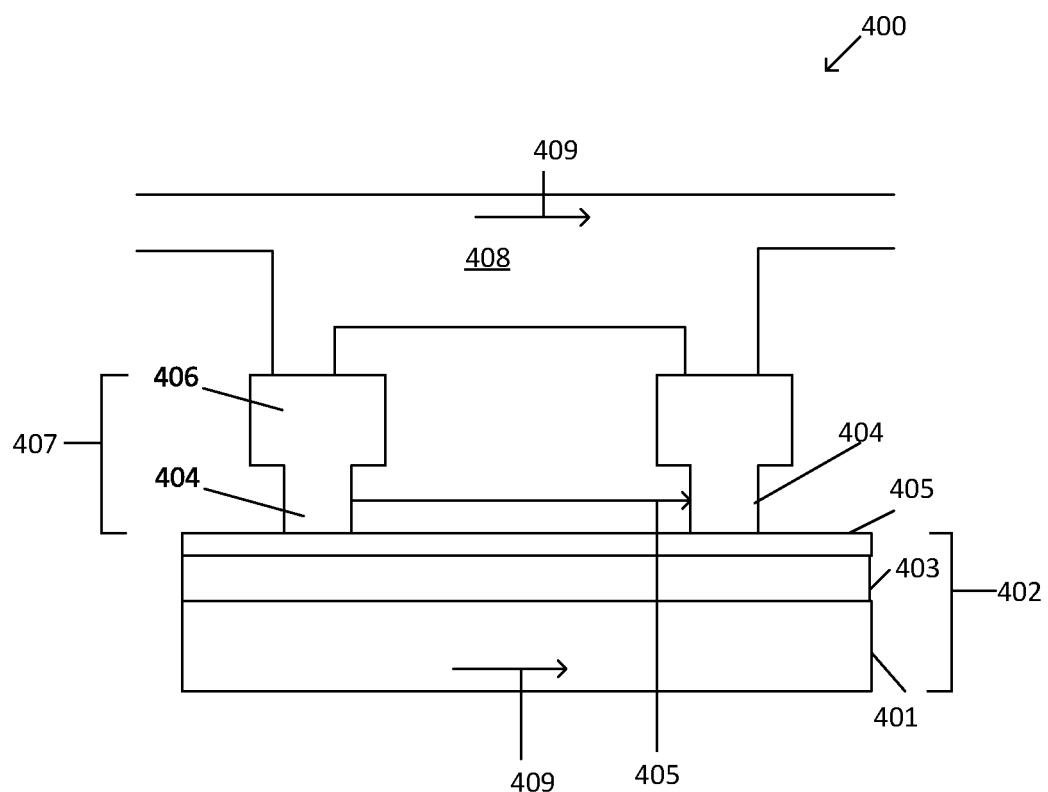
FIG. 4 represents a cross-sectional view of structures according to embodiments.

In FIG. 4, a portion of a wafer is shown, where a device structure, such as a portion of a die for example, is shown. A substrate 402 may comprise a first doping level region 401, a second doping level region 403, and a third doping level region 405, wherein the substrate 402 is coupled with at least one substrate tap structure 404. In an embodiment, the at least one substrate tap 404 may comprise a damascene structure 407, which may comprise a trench portion 406 and a via portion 404. In another embodiment, the at least one substrate tap structure 404 may comprise any other suitable structure/shape, depending upon the particular application. In an embodiment, a seed layer 408 may be landed onto a top portion of the at least one substrate tap 404, wherein interconnect structures, such as conductive traces, may be subsequently plated onto the seed layer 408.

In an embodiment, the second doping level region 403 of the substrate 402 may comprise a higher doping region than either of the first and third doping level regions 401, 405. In an embodiment, the second doping level region 403 may comprise a doping level of about $1 \times 10^{19}$ atoms/cm$^3$ and greater, but may comprise any suitable doping concentration that is greater than the first and third doping level regions 401, 405, according to the design requirements. The first doping level region 401 and the third doping level region 405 may comprise about $1 \times 10^{15}$ atoms/cm3 to about $1 \times 10^{18}$ atoms per cm3 respectively, in an embodiment. The dopants may comprise any suitable dopant species according to the particular application, and may comprise such dopant species as antimony, boron and phosphorus, in some applications.

In an embodiment, the second and third doping level regions 403, 405 may each comprise an epitaxial material, while the first doping level region 401 may comprise little to no epitaxial material. In an embodiment, the doping levels of the doping level regions 401, 403, 405 of the substrate 402 may be optimized in order to achieve about 50 Ohms per square to about 100 Ohms per square as measured at the seed layer 408. In an embodiment, the seed layer 408 and the substrate 402 may be capable of conducting in a substantially parallel 409 fashion with respect to one another. In an embodiment, the doping levels 401, 403, 405 may be optimized to greatly improve the uniformity of interconnect material/traces that may be subsequently formed on the seed layer 408.

By coupling the substrate taps 404 that are ohmically contacted to the substrate 402, in sufficient density to enable sheet resistance of at least 100 Ohms/sq at the seed layer 408, conduction of the seed layer 408 is enhanced and the terminal effect is reduced. Uniformity of subsequently plated interconnect structures is improved. In an embodiment, a density of the substrate taps 404, as reflected in a spacing 405 between adjacent substrate taps 404 may be designed/optimized to enable a sheet resistance of at least about 100 Ohms/sq as measured at the conductive/seed layer 408. In an embodiment, a density/spacing 405 of the substrate taps 404 may comprise about 1 micron to about 32 microns in an embodiment, but may vary according to the application, and a sheet resistance of the stack (substrate to tap to seed layer) including the seed layer may comprise about 50 to about 2,000 Ohms per square in an embodiment. The embodiments herein enable the fabrication of substrate tap structures that are in direct ohmic contact with the substrate at densities which improve electroplating thickness uniformity. The embodiments improve conduction and decrease terminal effects during electroplating processing. The various embodiments of the microelectronic structures described herein greatly increase yield and reliability of metallization structures/processing used in microelectronic fabrication of various device structures, such as but not limited to contact structures used to couple with transistor structures, other active circuit elements and passive elements, such as resistor and inductors, for example.

Figure 7:
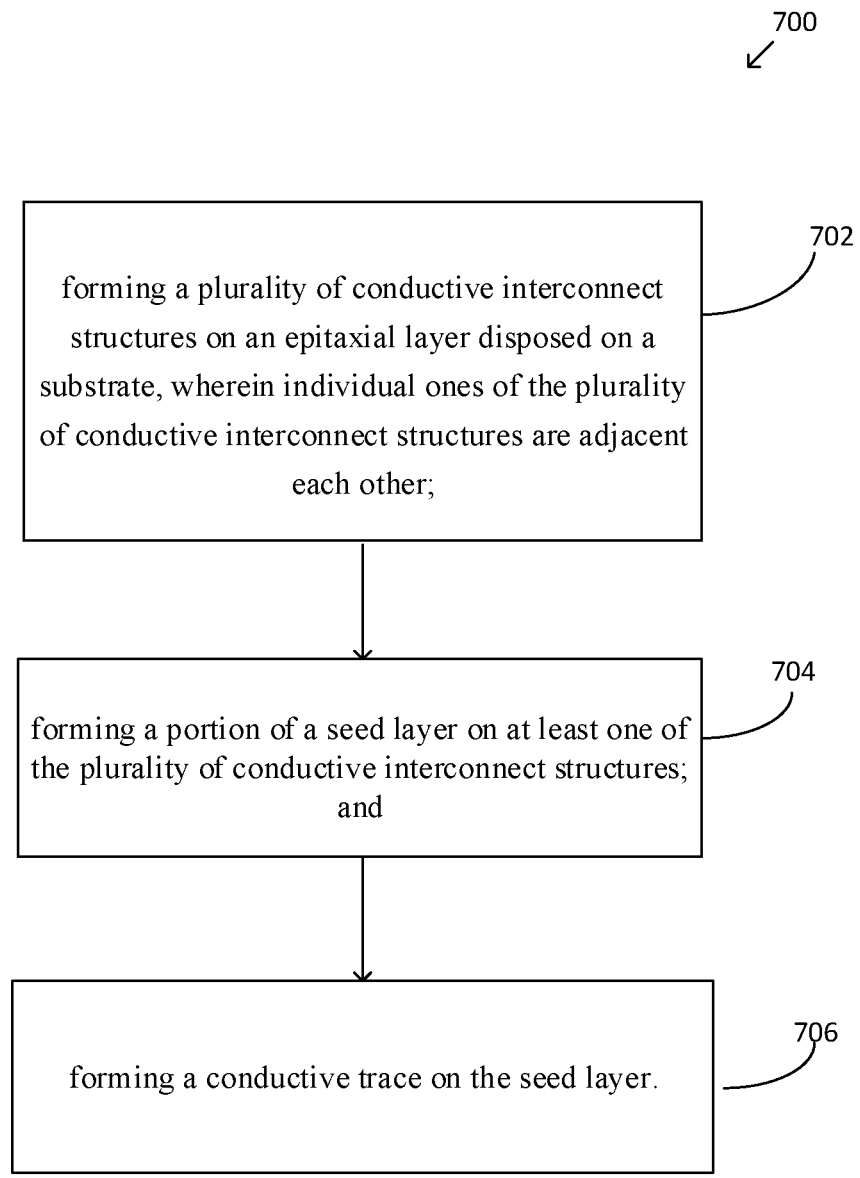
FIG. 7 represents a flow chart of a method according to embodiments.

FIG. 7 depicts a method 700 according to embodiments herein. At step 702, a a plurality of conductive interconnect structures may be formed on an epitaxial layer disposed on a substrate, wherein individual ones of the plurality of conductive interconnect structures are adjacent each other. In an embodiment, a spacing between adjacent ones of the plurality of conductive interconnect structures may comprise between about 1 micron to about 32 microns, and the plurality of conductive interconnect structures may be substantially parallel to each other in some embodiments. In an embodiment, the plurality of conductive interconnects may be disposed on a heavily doped portion of the substrate, and in the same or other embodiments, the plurality of conductive interconnect structures may be disposed in a guard ring portion of a die.

At step 704, a portion of a seed layer may be formed on at least one of the plurality of conductive interconnect structures. In some embodiments, the portion of the seed layer may be partially or substantially fully landed onto at least one of the plurality of conductive interconnect structures. In an embodiment, the seed layer may comprise a thickness of between about 1 nm to about 10 nm, and may be formed by an electroplating process. In an embodiment, a dummy feature may be disposed between at least one of the plurality of conductive interconnect structures and the seed layer. At step 706, a conductive trace may be formed on the seed layer. In an embodiment, the conductive trace may be electroplated onto the seed layer by an electroplating process, wherein the seed layer and the substrate conduct in a parallel direction with respect to each other during the electroplating process. In an embodiment, a sheet resistance of the seed layer may comprise between about 50 Ohms per square to about 2,000 Ohms per square.

The microelectronic device structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device/die structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

The embodiments herein may include portions of die/device structures, which may comprise any type of integrated circuit die/device. In one embodiment, the die may include a processing system (either single core or multicore). For example, an integrated circuit (IC) die may comprise a microprocessor, a graphics processor, a signal processor, a network processor, a chipset, etc. In one embodiment, the IC die 120 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on a die may comprise any suitable material or any suitable combination of materials, whether disposed in multiple layers or combined to form one or more alloys and/or one or more intermetallic compounds. For example, the terminals on die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds.

For example, the terminals on substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

Various die/devices of the embodiments herein may be coupled with a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

Figure 8:
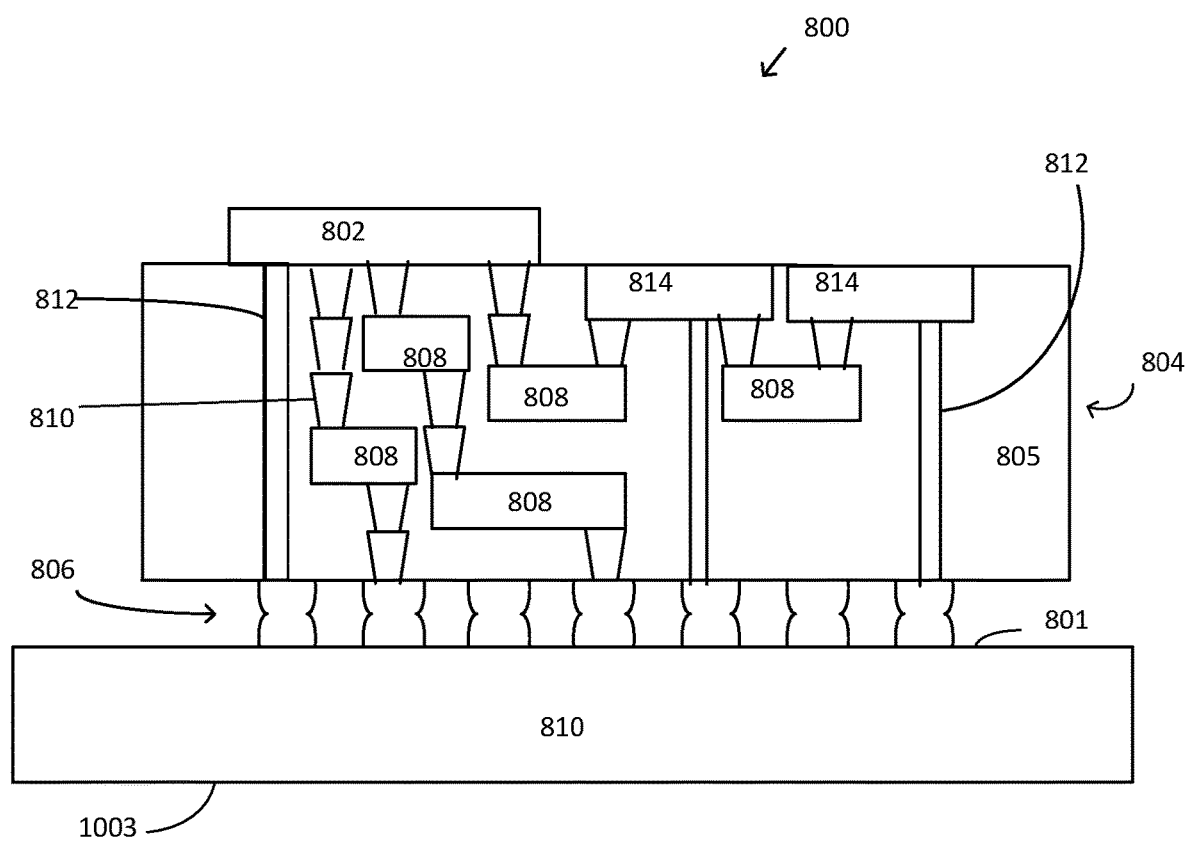
FIG. 8 represents a computer system implementing one or more embodiments.

Turning now to FIG. 8, illustrated is an embodiment of a computing system 800. The system 800 includes a mainboard 810, such as a motherboard or other circuit board. Mainboard 810 includes a first side 801 and an opposing second side 803, and various components may be disposed on either one or both of the first and second sides 801, 803. In the illustrated embodiment, the computing system 800 includes a die 802, such as any of the die/device structures of the embodiments herein, disposed on a substrate 804. The substrate 804 may comprise an interposer 804, for example. The substrate 804 may comprise various levels of conductive layers 814, 808, for example, which may be electrically and physically connected to each other by via structures 810. The substrate 804 may further comprise through substrate vias 812. Dielectric material 805 may separate/isolate conductive layers from each other within the substrate 804. Joint structures 806, may electrically and physically couple the substrate 804 to the board 810. The computing system 800 may comprise any of the embodiments described herein.

System 800 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 810 may comprise any suitable type of circuit board or other substrate capable of providing electrical communication between one or more of the various components disposed on the board. In one embodiment, for example, the mainboard 810 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 810. However, it should be understood that the disclosed embodiments are not limited to the above-described PCB and, further, that mainboard 810 may comprise any other suitable substrate.

Figure 9:
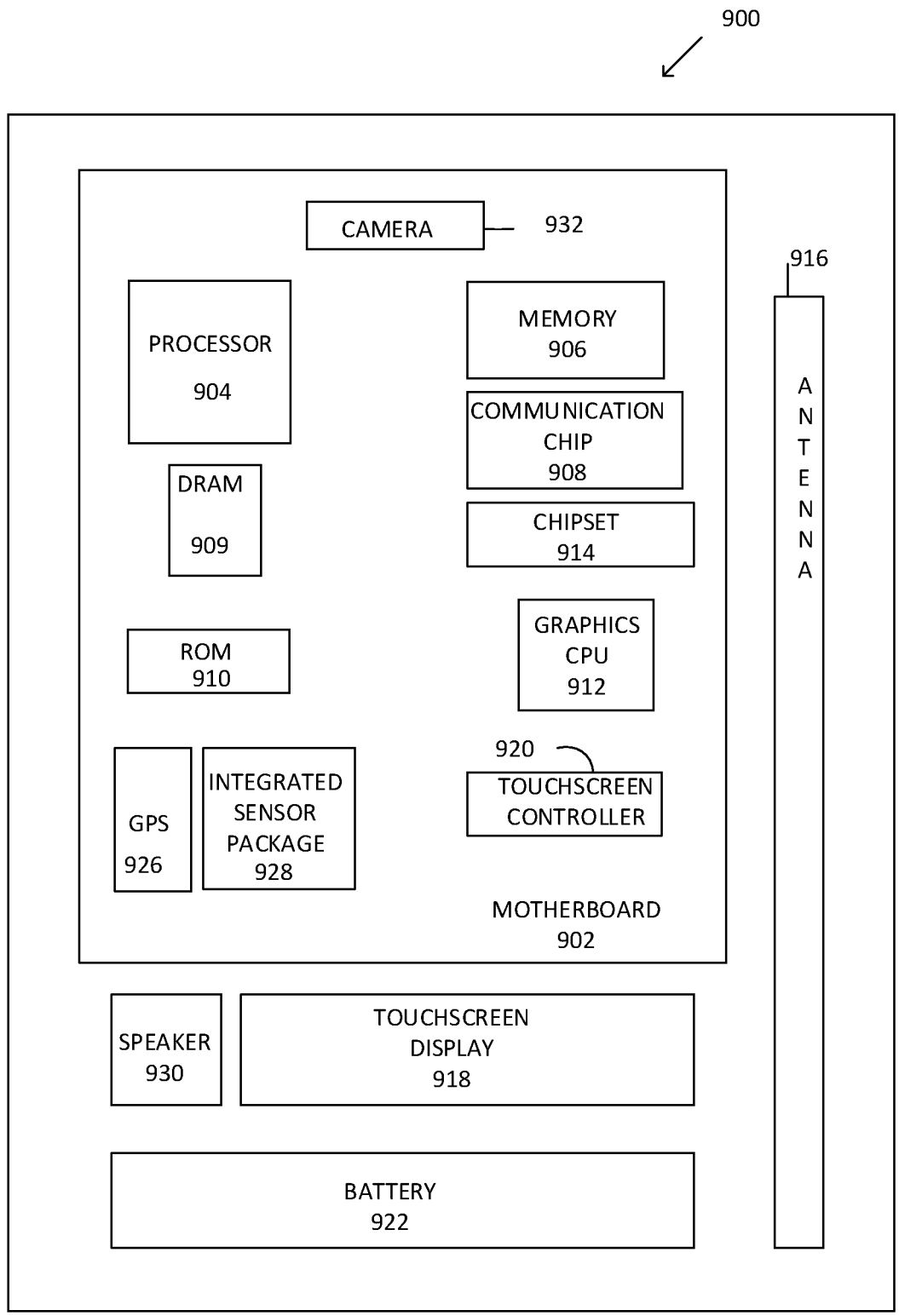
FIG. 9 represents a schematic of a computing device according to embodiments.

FIG. 9 is a schematic of a computing device 900 that may be implemented incorporating embodiments of the package structures described herein. For example, any suitable ones of the components of the computing device 900 may include, or be included in, device/die structures of the various embodiments disclosed herein. In an embodiment, the computing device 900 houses a board 902, such as a motherboard 902 for example. The board 902 may include a number of components, including but not limited to a processor 904, an on-die memory 906, and at least one communication chip 908. The processor 904 may be physically and electrically coupled to the board 902. In some implementations the at least one communication chip 908 may be physically and electrically coupled to the board 902. In further implementations, the communication chip 908 is part of the processor 904.

Depending on its applications, computing device 900 may include other components that may or may not be physically and electrically coupled to the board 902, and may or may not be communicatively coupled to each other. These other components include, but are not limited to, volatile memory (e.g., DRAM) 909, non-volatile memory (e.g., ROM) 910, flash memory (not shown), a graphics processor unit (GPU) 912, a chipset 914, an antenna 916, a display 918 such as a touchscreen display, a touchscreen controller 920, a battery 922, an audio codec (not shown), a video codec (not shown), a global positioning system (GPS) device 926, an integrated sensor 928, a speaker 930, a camera 932, compact disk (CD) (not shown), digital versatile disk (DVD) (not shown), and so forth). These components may be connected to the system board 1102, mounted to the system board, or combined with any of the other components.

The communication chip 908 enables wireless and/or wired communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 900 may include a plurality of communication chips 908. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 900 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic device structure comprising an epitaxial layer disposed on a substrate, a plurality of interconnect structures disposed on the epitaxial layer, wherein the plurality of interconnect structures are electrically and physically coupled with the epitaxial layer, and a spacing between adjacent ones of the plurality of interconnect structures comprises between about 1 micron and about 32 microns, and a seed layer disposed on at least one of the plurality of interconnect structures.

Example 2 includes the microelectronic device structure of example 1, wherein at least one of the plurality of interconnect structures comprise a via structure, and is electrically coupled with a trench structure of a metal line disposed on the seed layer.

Example 3 includes the microelectronic device structure of example 1 wherein the substrate comprises a first doping level region, a second doping level region and a third doping level region, wherein the second doping level region is disposed between the first doping level region and the third doping level region, and wherein a doping level of the second doping level region is an order of magnitude greater than a doping level of the first doping level region or the third doping level region.

Example 4 includes the microelectronic device structure of example 3 wherein a doping level of the second doping level region comprises greater than about $1\times10^{19}$ atoms per $cm^2$.

Example 5 includes the microelectronic device structure of example 1 wherein the plurality of interconnect structures are in direct ohmic contact with the substrate.

Example 6 includes the microelectronic device structure of example 1 wherein a sheet resistance of the seed layer comprises between about 100 Ohms per square and about 2000 Ohms per square.

Example 7 includes the microelectronic device structure of example 1 wherein the plurality of interconnect structures are disposed in a guard ring region of the substrate.

Example 8 includes the microelectronic device structure of example 1 wherein an electrically floating dummy feature is disposed between at least one of the plurality of interconnect structures and the seed layer.

Example 9 is a microelectronic device structure comprising a substrate, an epitaxial layer on the substrate, an array of conductive interconnect structures disposed on the epitaxial layer, wherein bottom portions of individual ones of the array of conductive interconnect structures are in direct ohmic contact with the epitaxial layer, and a conductive layer disposed on the array of interconnect structures.

Example 10 includes the microelectronic device structure of example 9 wherein a portion of the conductive layer is landed on a portion of at least one of the array of conductive interconnect structures.

Example 11 includes the microelectronic device structure of example 9 wherein the array of conductive interconnect structures comprises an array of substrate taps, and wherein the conductive layer and the substrate are capable of conducting parallel to each other.

Example 12 includes the microelectronic device structure of example 9 wherein at least one dummy structure is disposed between the conductive layer and at least one of the array of conductive interconnect structures.

Example 13 includes the microelectronic device structure of example 9 wherein the conductive layer comprises copper.

Example 14 includes the microelectronic device structure of example 9 wherein at least one of the array of conductive interconnect structures comprise a damascene structure.

Example 15 includes the microelectronic device structure of example 9 wherein a spacing between adjacent ones of the array of conductive interconnect structures comprises between about 1 micron and about 32 microns.

Example 16 includes the microelectronic device structure of example 9, wherein the array of conductive interconnect structures comprise a plurality of vertically stacked substrate taps disposed in a guard ring region of the device.

Example 17 is a method of forming a microelectronic device, comprising forming a plurality of conductive interconnect structures on an epitaxial layer disposed on a substrate, wherein individual ones of the plurality of conductive interconnect structures are adjacent each other, forming a portion of a seed layer on at least one of the plurality of conductive interconnect structures, and forming a conductive trace on the seed layer.

Example 18 includes the method of example 17 wherein forming the conductive trace comprises forming the conductive trace by electroplating.

Example 19 includes the method of example 17 wherein forming the plurality of conductive interconnect structures comprises forming a plurality of substrate taps that comprise an ohmic contact with the substrate.

Example 20 includes the method of example 17 wherein the seed layer comprises a thickness that is between about 1 nm to about 10 nm.

Example 21 includes the method of example 17 wherein the conductive trace is formed by utilizing an electroplating process.

Example 22 includes the method of example 17 further comprising wherein at least one of the plurality of conductive interconnect structures is formed in a guard ring region of the device.

Example 23 includes the method of example 17 further comprising wherein at least one of the plurality of conductive interconnect structures is formed on a portion of a dummy structure.

Example 24 includes the method of example 17 further comprising wherein a spacing between adjacent ones of the plurality of conductive interconnect structures is between about 1 micron and about 32 microns.

Example 25 includes the method of example 17 wherein at least one of the plurality of conductive interconnect structures is formed on a highly doped epitaxial region of the substrate.

Example 26 includes the device of example 1 further comprising wherein a density of at least one of the plurality of conductive interconnect structures is capable of producing a sheet resistance in the seed layer of between about 50 Ohms/sq to about 2000 Ohms/sq.

Example 27 is the method of example 17 wherein the portion of the seed layer comprises one of a landed portion or a partially landed portion.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic device structure, comprising:
   a doped substrate layer comprising a contiguous impurity doping spanning an entirety of the doped substrate layer;
   a plurality of circuit layers over the doped substrate layer, each of the circuit layers comprising interconnect structures coupling together passive or active circuit elements; and
   a plurality of tap structures in contact with the doped substrate layer, wherein individual ones of the tap structures are electrically connected to a stack of dummy interconnect structures electrically insulated from all of the interconnect structures coupling together the passive or active circuit elements, but electrically coupled to each other through the doped substrate layer.

2. The microelectronic device structure of claim 1, wherein adjacent ones of the tap structures are spaced apart by at least 1 micron.

3. The microelectronic device structure of claim 2, wherein adjacent ones of the tap structures are spaced apart by no more than 32 microns.

4. The microelectronic device structure of claim 1, wherein the dummy interconnect structures are limited to a periphery of the microelectronic device structure.

5. The microelectronic device structure of claim 1, wherein the doped substrate layer comprises a top layer with a first impurity doping level, a middle layer with a second impurity doping level, and a bottom layer with a third impurity doping level, wherein a doping level of the middle layer is greater than a doping level of the top or the bottom layers.

6. The microelectronic device structure of claim 5, wherein the second impurity doping level is greater than $1 \times 10^{19}$ atoms/cm3.

7. The microelectronic device structure of claim 1, wherein the plurality of tap structures are in direct ohmic contact with the doped substrate layer.

8. The microelectronic device structure of claim 1, wherein individual ones of the dummy interconnect structures extend through the plurality of the circuit layers, wherein the dummy interconnect structures comprise both dummy trench structures and dummy via structures, the dummy via structures stacked between the dummy trench structures, wherein the dummy trench structures are adjacent to trench structures of the interconnect structures that couple together the passive or active circuit elements, and wherein the dummy via structures are adjacent to via structures of the interconnect structures that couple together the passive or active circuit elements.

9. The microelectronic device structure of claim 1 further comprising second interconnect structures comprising a guard ring surrounding the passive or active circuit elements.

10. A microelectronic device, comprising:
    a power supply;
    a memory and a processor coupled to the power supply, wherein the processor comprises the microelectronic device structure of claim 1.

11. The microelectronic device structure of claim 10, wherein the plurality of tap structures are arrayed over the doped substrate layer with adjacent ones of the tap structures spaced apart by the interconnect structures, and wherein the tap structures are in ohmic contact with the doped substrate layer.

12. The microelectronic device structure of claim 10, wherein the dummy interconnect structures and the interconnect structures both comprise copper.

13. The microelectronic device structure of claim 10, wherein individual ones of the dummy interconnect structures comprise a stack of dummy damascene structures electrically coupled to the tap structures, and individual ones of the interconnect structures comprise a stack of damascene structures adjacent to the dummy damascene structures, but not electrically coupled to the tap structures.

14. The microelectronic device structure of claim 10, wherein a spacing between adjacent ones of the tap structures is between 1 micron and 32 microns.

* * * * *